United States Patent [19]

Chen et al.

[11] Patent Number: 5,733,813
[45] Date of Patent: Mar. 31, 1998

[54] METHOD FOR FORMING PLANARIZED FIELD ISOLATION REGIONS

[75] Inventors: Hung Sheng Chen; Chih Sieh Teng, both of San Jose, Calif.

[73] Assignee: National Semiconductor Corporation, Santa Clara, Calif.

[21] Appl. No.: 644,005

[22] Filed: May 9, 1996

[51] Int. Cl.$^6$ ................................................ H01L 21/76
[52] U.S. Cl. ............................................... 438/440
[58] Field of Search ............................. 437/24, 26, 62; 148/DIG. 85, DIG. 86, DIG. 117; 438/440

[56] References Cited

U.S. PATENT DOCUMENTS

| | | |
|---|---|---|
| 3,897,274 | 7/1975 | Stehlin et al. . |
| 4,975,126 | 12/1990 | Margail et al. . |
| 5,393,693 | 2/1995 | Ko et al. . |

FOREIGN PATENT DOCUMENTS

| | | |
|---|---|---|
| 2941653 | 4/1981 | Germany . |
| 2-10835 | 1/1990 | Japan . |
| 3-24727 | 2/1991 | Japan . |
| 5121540 | 5/1993 | Japan . |

OTHER PUBLICATIONS

Ratman, P., et al, "Selectively Implanted Oxygen Isolation Technology (SIO)", Electronics Letters May 1985, vol. 21, No. 10, pp. unknown.

Jastrzebslej, L., et al, "The Effect of . . . CMOS/SIMOX Devices", IEEE Electron Device Letters, vol. 9, No. 3, Mar. 1988, pp. 151–153.

Davis, J.R., et al, "Dielectrically Isolated Silicon–on–Insulator Islands by Masteed Oxygen Implantation", Appl. Phys. Lett. 51(1987), 2 Nov. No. 18, pp. 1419–1421.

Bryant, A. et al., "Characteristics of CMOS Device Isolation for the ULSI Age," *IEDM* (1994), pp. 671–674, (1994).

Colinge, Jean–Pierre, "Recent Advances in SOI Technology," *IEDM*, pp. 817–820, (1994).

Chen, Hung–Sheng, "A Model for Analyzing the Interface Properties of a Semiconductor–Insulator–Semiconductor Structure–I: Capacitance and Conductance Techniques," *IEEE Trans. Electron Devices*, vol. 39, No. 7, pp. 1740–1746, (Jul. 1992).

Ahn, D.H. et al., "A Highly Practical Modified LOCOS Isolation Technology for the 256 Mbit DRAM," *IEDM*, pp. 679–682, (1994).

Chen, Hung–Sheng, "Determination of Generation Lifetime and Interface State Density Using a Pulsed Silicon–Insulator–Silicon Capacitor," *Solid State Electronics*, vol. 35, No. 3, pp. 371–377, (1992).

Wolf, S., "Silicon Processing For the VLSI Era–Volume 2: Process Integration," Sunset Beach, CA, note pp. 72–74, (1990).

Primary Examiner—George R. Fourson
Attorney, Agent, or Firm—Limbach & Limbach L.L.P.

[57] ABSTRACT

Planarized field isolation regions are formed in a semiconductor substrate to isolate adjacent semiconductor devices by implanting an isolation material, such as oxygen or nitrogen ions, into a substrate patterned to define the field isolation regions. The implanted isolation material combines with the silicon in the substrate to form a field isolation region that extends downward from the surface of the substrate.

10 Claims, 3 Drawing Sheets

5,733,813

METHOD FOR FORMING PLANARIZED FIELD ISOLATION REGIONS

BACKGROUND OF THE INVENTION

1. Field of the Invention

The present invention relates to a method for forming field isolation regions and, more particularly, to a method for forming planarized field isolation regions by implanting an isolation material into the substrate areas that are to become isolation regions.

2. Description of the Related Art

Adjacent MOSFET devices are commonly isolated from each other by regions of field oxide that extend well into the substrate and physically separate the devices. The most common technique for forming these field oxide regions is the well-known local oxidation of silicon (LOCOS) process.

FIG. 1 shows a cross-sectional diagram that illustrates the formation of a pair of field oxide regions FOX using the LOCOS process. As shown in FIG. 1, in the LOCOS process, a thin layer of pad oxide 10 is formed over a substrate 8, followed by the formation of a thicker overlying layer of silicon nitride 12. The layer of silicon nitride 12 is patterned, and then the layer of silicon nitride 12 and the underlying layer of oxide 10 are etched to expose selected regions 14 of substrate 8. Following this, the selected regions 14 are oxidized to form the field oxide regions FOX.

Although commonly used with 0.5 micron devices, LOCOS-formed field oxide regions have numerous drawbacks that limit further downward scaling of the regions. Most notable among these drawbacks is the excessive lateral encroachment of the field oxide FOX by the so-called "bird's beak" regions.

The "bird's beak" regions, as shown in FIG. 1, are the tapered regions of field oxide FOX that force up the edges of the overlying layer of silicon nitride 12, thereby extending the width of the field oxide regions FOX.

Thus, as a result of the bird's beak effect, the minimum width of the field oxide regions FOX will always be significantly larger than the minimum feature size that is photolithographically obtainable. This, in turn, significantly reduces the packing density that can be obtained as compared to the width of a field oxide region that is approximately equal to the minimum photolithographic feature size.

Another drawback associated with LOCOS-formed field oxide regions is that the step heights of the field oxide regions FOX, as measured from the surface of substrate 8, are limited by the widths of the selected regions 14 as defined in the patterning and etching step. Thus, as further shown in FIG. 1, as the width of a field oxide region FOX decreases in size, the step height of the field oxide region FOX also decreases in size. This change in step height, known as "oxide thinning", reduces the isolation provided by the field oxide regions FOX.

These and other drawbacks, including a substantially non-planar top surface and channel implant encroachment, make LOCOS-formed field oxide regions FOX less than satisfactory for sub half-micron processes.

Another technique for forming the field oxide regions FOX is the so-called "poly-buffer" LOCOS process. Generally speaking, the "poly-buffer" LOCOS process is a variation of the conventional LOCOS process that differs by lining the sidewalls of the selected regions 14 with silicon nitride.

FIGS. 2A–2C show cross-sectional diagrams that illustrate the formation of a field oxide region FOX using the "poly-buffer" LOCOS process. As shown in FIG. 2A, a thin layer of oxide 20 is formed over a substrate 8, followed by the formation of a layer of polysilicon 22 and an overlying layer of silicon nitride 24. The resultant structure is then patterned and etched until selected regions 14 of substrate 8 are slightly trenched.

Referring to FIG. 2B, after the etching step has been completed, the structure is oxidized to form a thin layer of oxide 26 on the sides of the layers of polysilicon 22, and the exposed regions of substrate 8. Next, a thin layer of silicon nitride 28 is formed on the thin layer of oxide 26 over the sides of the layers of polysilicon 22, and the vertical sides of the selected regions 14.

Referring to FIG. 2C, with the thin layer of silicon nitride 28 in place, the selected regions 14 are then oxidized to form the field oxide regions FOX. As shown in FIG. 2C, the nitride lining of the trenched opening significantly suppresses lateral encroachment by the bird's beak regions.

Although a significant improvement over the conventional LOCOS process, the poly-buffer process stills suffers from oxide thinning, and a substantially non-planarized surface. In addition, the poly-buffer process significantly increases the complexity of the overall process flow. As a result, the poly-buffer LOCOS process is generally considered to be limited to feature sizes of 0.35 microns and above.

Many if not all of the drawbacks associated with LOCOS and poly-buffered field oxide regions are eliminated by a technique known as "trench isolation". With "trench isolation", the substrate is first trenched, and then the trenches are filled with oxide and planarized. Thus, for example, trench isolation produces fully planarized field oxide regions which have a uniform thickness, and a width which is substantially equal to the minimum feature size of the photolithographic process.

FIGS. 3A–3D show cross-sectional diagrams that illustrate the formation of a series of trenched oxide regions. As shown in FIG. 3A, a thin layer of silicon nitride 32 is formed over a substrate 8. Following this, the layer of nitride 32 is patterned and then etched until selected regions 14 of substrate 8 are trenched.

Next, as shown in FIG. 3B, the exposed substrate regions are oxidized to grow a thin layer of oxide 34 on the exposed surfaces. After the thin layer of oxide 34 has been grown, a thick layer of oxide 36 is deposited over the entire structure as illustrated in FIG. 3C. Following this, as shown in FIG. 3D, the resulting structure is planarized until the silicon nitride 32 and the excess thick oxide 36 have been removed, thereby forming a series of field oxide regions 38.

As can be seen in FIG. 3D and as noted above, trench isolation suffers from relatively few drawbacks. One drawback, however, is that for relatively wide field oxide regions 38, the common planarization processes, such as reactive ion etching (RIE) and chemical mechanical polishing (CMP), have a tendency to dish or reduce the thickness of the oxide in the central portion of the field oxide region 38.

Another drawback is that trench isolation is also a relatively complex process. Thus, there is a need for a process for forming planarized field oxide regions that maintains all of the advantages provided by trench isolation, and also eliminates dishing and is less complex than the conventional trench isolation process.

SUMMARY OF THE INVENTION

The present invention provides a method for forming planarized field isolation regions in a semiconductor substrate by implanting an isolation material into a substrate patterned to define the field isolation regions.

The method of the present invention begins by forming a layer of patterning material on a semiconductor substrate. Following this, the layer of patterning material is patterned and etched to expose a surface region of the substrate. Next, in accordance with the present invention, the surface region of the substrate is implanted with an isolation material, such as oxygen or nitride. The implanted isolation material combines with the silicon in the substrate to form a field isolation region that extends downward from the surface of the substrate.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
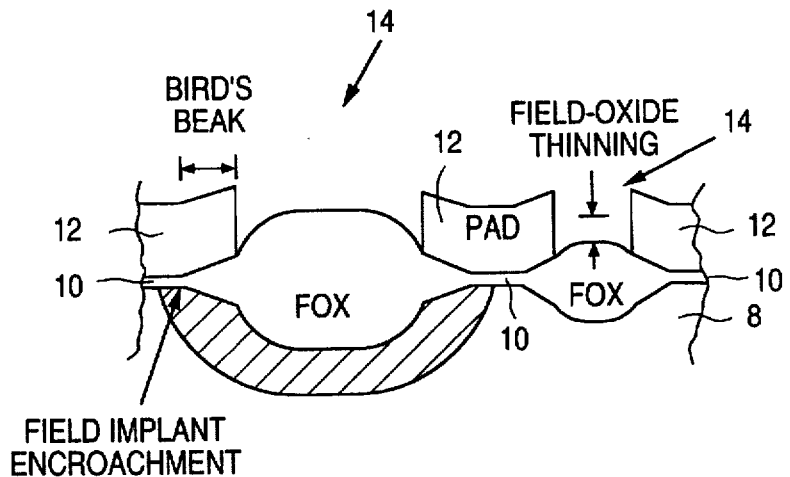
FIG. 1 is a cross-sectional diagram illustrating the formation of a pair of field oxide regions FOX using the LOCOS process.
Figure 2A:
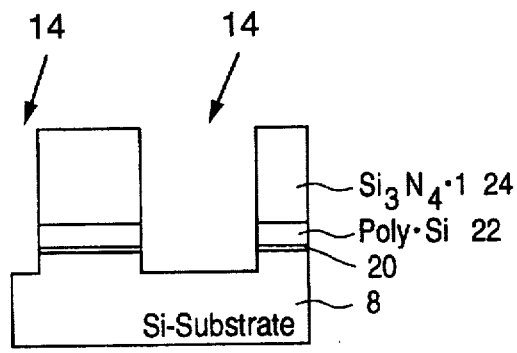
FIGS. 2A–2C are cross-sectional diagrams illustrating the formation of a field oxide region FOX using the "poly-buffer" LOCOS process.
Figure 2B:
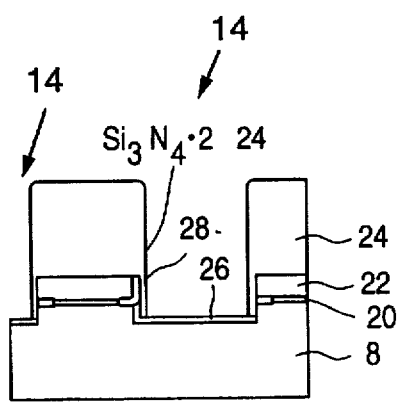
Figure 2C:
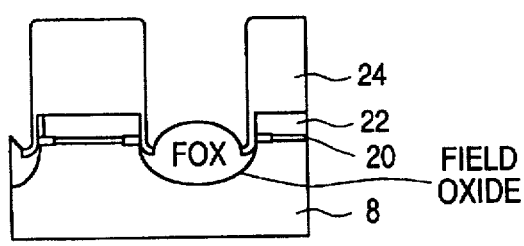
Figure 3A:
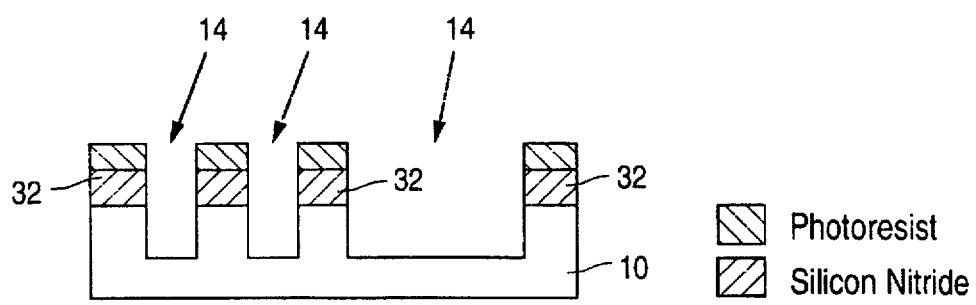
FIGS. 3A–3D are cross-sectional diagrams illustrating the formation of a series of trenched oxide regions.
Figure 3B:
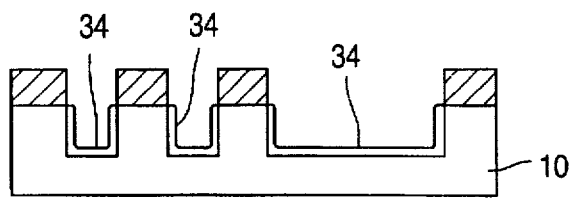
Figure 3C:
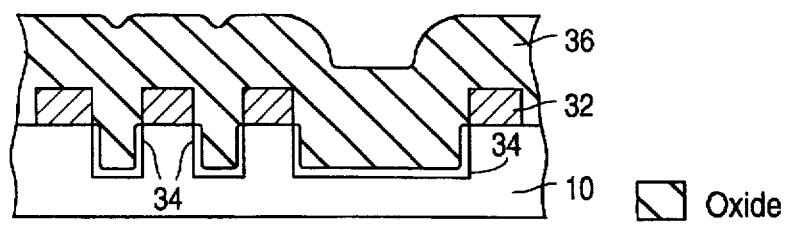
Figure 3D:
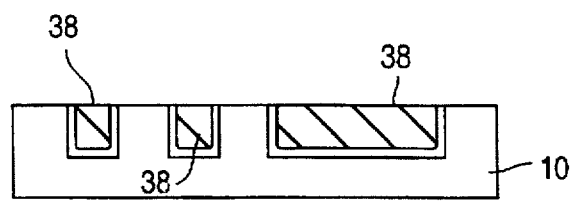
Figure 4A:
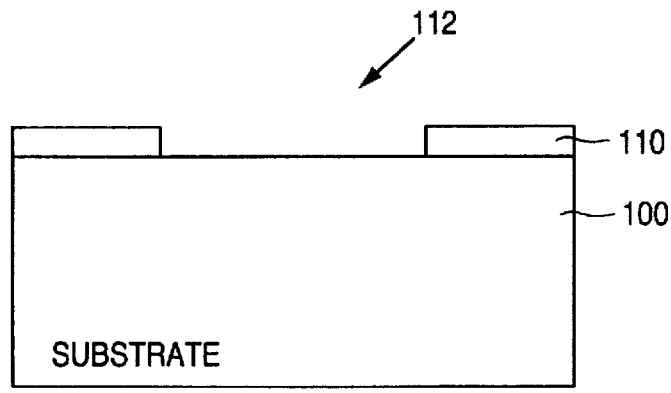
FIGS. 4A–4C are cross-sectional diagrams illustrating a process for forming planarized field isolation regions in accordance with the present invention.
Figure 4B:
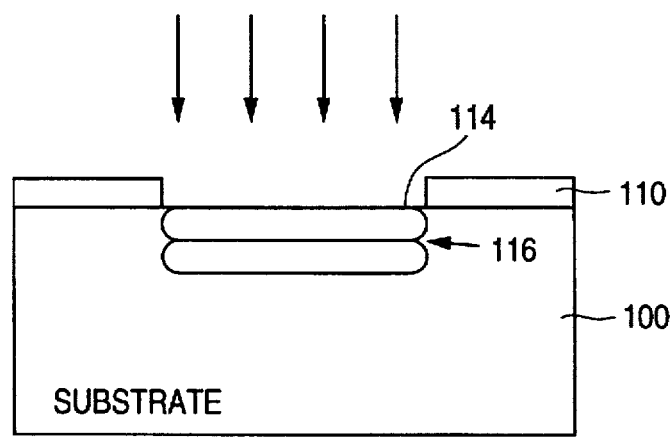
Figure 4C:
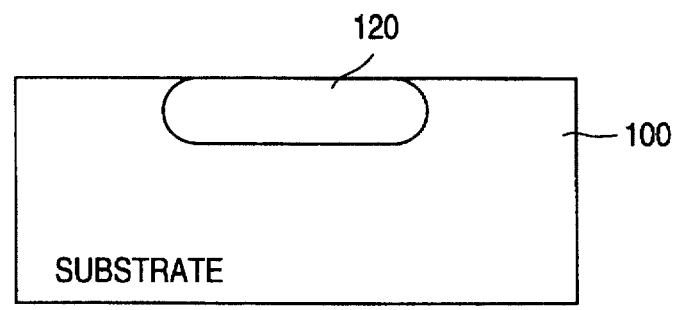

FIGS. 4A–4C show cross-sectional diagrams that illustrate a process for forming planarized field isolation regions in accordance with the present invention. As described in greater detail below, the present process substantially simplifies the process required to form planarized field isolation regions by implanting an isolation material into the substrate regions that are to become isolation regions rather than depositing oxide into trenched substrate regions as is conventionally the case.

As shown in FIG. 4A, the process of the present invention begins by forming a layer of patterning material 110 on a semiconductor substrate 100. The layer of patterning material 110 is preferably formed by forming a thin layer of oxide, followed by the formation of a thicker layer of silicon nitride. The thin layer of oxide acts as a buffer to relieve stress from the overlying silicon nitride layer which functions as a hard mask.

Next, the patterning material (nitride layer) is patterned to define a series of field isolation openings. Following this, the unmasked areas of the patterning material 110 are etched until a corresponding series of surface sections 112 of substrate 100 are exposed. After the etch has been completed, as shown in FIG. 4B, a thin layer of screen oxide 114 is grown over the exposed surface sections 112 of substrate 100 to protect substrate 100 from subsequent processing steps.

Following this, in accordance with the present invention, the screen oxide covered surfaces of substrate 100 are implanted with an isolation material, such as oxygen ions (O⁺), nitrogen ions (N+), or other similar ions, to form an implant region 116 that extends downward from the top surface of substrate 100. The wafer can be externally heated to insure that the surface maintains its crystallinity during the implantation steps, or may use the heat generated from the implant.

The oxygen or nitrogen ions can be implanted by using a single implant step at a dose within the range of $1\times10^{17}$ to $1\times10^{20}$ cm$^{-2}$, and an energy within the range of 50 KeV to 4 MeV. Optionally, multiple implant steps of the same dose and energy can be used when greater field isolation depths are desired.

Referring to FIG. 4C, after the implant step has been completed, the layer of patterning material 110 is removed. Next, substrate 100 is annealed at a temperature within the range of 1,000°–1,400° C. for a sufficient time, such as 2–10 hours, in a neutral ambient, such as N$_2$.

In the annealing step, the implanted oxygen (or nitrogen) ions combine with the silicon substrate to form a field isolation region 120 that extends downward from the top surface of substrate 100. In addition, the annealing step also repairs the damage to the silicon lattice that was caused by the implantation step.

Following this, the layer of screen oxide 114 is removed, and the process continues with conventional process steps. With respect to the overall fabrication process, the process flow of the present invention can be inserted before or after field and any well implants are performed.

Thus, in accordance with the present invention, a method has been described for forming field isolation regions having a fully planarized top surface without dishing (only the thin layer of screen oxide 114 needs to be removed from the surface of substrate 100), an abrupt active to isolation region transition that is free from the bird's beak effect (due to the directionality of the implant), and a uniform field oxide thickness (due to the depth uniformity of the implants). Further, the present method, in addition to being less complex than the trench isolation process, is highly scalable since the width of the implant is defined by the width of the pattern formed on the layer of patterning material.

It should be understood that various alternatives to the embodiment of the invention described herein may be employed in practicing the invention. Therefore, it is intended that the following claims define the scope of the invention and that methods and structures within the scope of these claims and their equivalents be covered thereby.

What is claimed is:

1. A method for forming field isolation regions in a silicon substrate, the method comprising the steps of:

forming a masking layer on the substrate;

patterning and etching the masking layer to expose a surface region of the substrate;

implanting the surface region of the substrate with a material to form an implant region that extends downward from the top surface of the substrate; and annealing the substrate in an ambient having substantially no oxygen so that the material in the implanted region chemically reacts with the silicon substrate to form a field isolation region that extends downward from the top surface of the substrate.

2. The method of claim 1 wherein the masking layer includes a layer of oxide and an overlying layer of silicon nitride.

3. The method of claim 1 wherein the material includes oxygen ions.

4. The method of claim 1 wherein the material is implanted in multiple steps prior to the annealing step.

5. The method of claim 1 wherein the material includes nitrogen ions.

6. The method of claim 1 and further comprising the step of removing the masking layer prior to the annealing step.

7. The method of claim 1 wherein the ambient includes nitrogen.

8. The method of claim 5 wherein the nitrogen ions are implanted in multiple steps prior to the annealing step.

9. The method of claim 1 and further comprising the step of forming a layer of screen oxide over the surface region prior to the implanting step.

10. The method of claim 9 and further comprising the step of removing the layer of screen oxide after the annealing step.

* * * * *